US011887949B2

(12) United States Patent
Lo et al.

(10) Patent No.: US 11,887,949 B2
(45) Date of Patent: Jan. 30, 2024

(54) BOND PAD LAYOUT INCLUDING FLOATING CONDUCTIVE SECTIONS

(71) Applicant: MACRONIX INTERNATIONAL CO., LTD., Hsinchu (TW)

(72) Inventors: Su-Chueh Lo, Hsinchu (TW); Jian-Syu Lin, Chiayi (TW); Yi-Fan Chang, Taoyuan (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 295 days.

(21) Appl. No.: 17/405,812

(22) Filed: Aug. 18, 2021

(65) Prior Publication Data
US 2023/0056520 A1 Feb. 23, 2023

(51) Int. Cl.
*H01L 23/00* (2006.01)

(52) U.S. Cl.
CPC .... *H01L 24/05* (2013.01); *H01L 2224/04042* (2013.01); *H01L 2224/05011* (2013.01); *H01L 2224/05013* (2013.01); *H01L 2224/05014* (2013.01); *H01L 2224/05016* (2013.01); *H01L 2224/05082* (2013.01); *H01L 2224/05088* (2013.01); *H01L 2224/05095* (2013.01)

(58) Field of Classification Search
CPC ........... H01L 24/05; H01L 2224/04042; H01L 2224/05082; H01L 2224/05095; H01L 2224/0401; H01L 2924/00014; H01L 23/522; H01L 2224/05011; H01L 2224/05013; H01L 2224/05014
See application file for complete search history.

(56) References Cited

U.S. PATENT DOCUMENTS 4,636,832 A 1/1987 Abe et al.
6,465,337 B1 10/2002 Lee et al.
(Continued)

FOREIGN PATENT DOCUMENTS

CN 102931155 A * 2/2013 ........... H01L 23/562
JP 2008258258 A * 10/2008 ............. H01L 24/05
(Continued)

OTHER PUBLICATIONS

TW Search Report from TW1112086370 dated Aug. 31, 2022, 13 pages.

*Primary Examiner* — Mamadou L Diallo
(74) *Attorney, Agent, or Firm* — Andrew L. Dunlap; Haynes Beffel & Wolfeld LLP

(57) ABSTRACT

Disclosed is a semiconductor device that has a first layer including conductive material, a bond wire coupled to an upper surface of the first layer, and a second layer including conductive material underneath the first layer. One or more interconnects couple the second layer to the first layer. In an example, the second layer has a plurality of discontinuous sections that includes (i) a connected section coupled to the one or more interconnects and (ii) one or more floating sections that are at least in part surrounded by the connected section, where the one or more floating sections are electrically floating and isolated from the connected section. The semiconductor device also includes an under-pad circuit on a substrate underneath the second layer, the under-pad circuit to transmit signals to one or more components external to the semiconductor device though the first layer.

18 Claims, 12 Drawing Sheets

(56) References Cited

U.S. PATENT DOCUMENTS

| | | | |
|---|---|---|---|
| 7,741,724 B2 | 6/2010 | Morikawa et al. | |
| 8,138,616 B2 * | 3/2012 | Chang | H01L 23/522 |
| | | | 257/784 |
| 9,153,555 B2 | 10/2015 | Lee et al. | |
| 10,256,201 B2 * | 4/2019 | Tu | H01L 24/05 |
| 2002/0003305 A1 | 1/2002 | Umakoshi et al. | |
| 2009/0294970 A1 * | 12/2009 | Stockinger | H01L 24/48 |
| | | | 257/762 |
| 2010/0065954 A1 * | 3/2010 | Tu | H01L 25/0655 |
| | | | 257/784 |
| 2013/0277860 A1 * | 10/2013 | Weng | H01L 23/481 |
| | | | 257/773 |
| 2015/0270234 A1 * | 9/2015 | Li | H01L 24/05 |
| | | | 257/775 |
| 2018/0294243 A1 * | 10/2018 | Risaki | H01L 23/60 |

FOREIGN PATENT DOCUMENTS

| | | |
|---|---|---|
| TW | I370500 B | 8/2012 |
| TW | 201308542 A | 2/2013 |
| TW | 202046476 A | 12/2020 |

\* cited by examiner

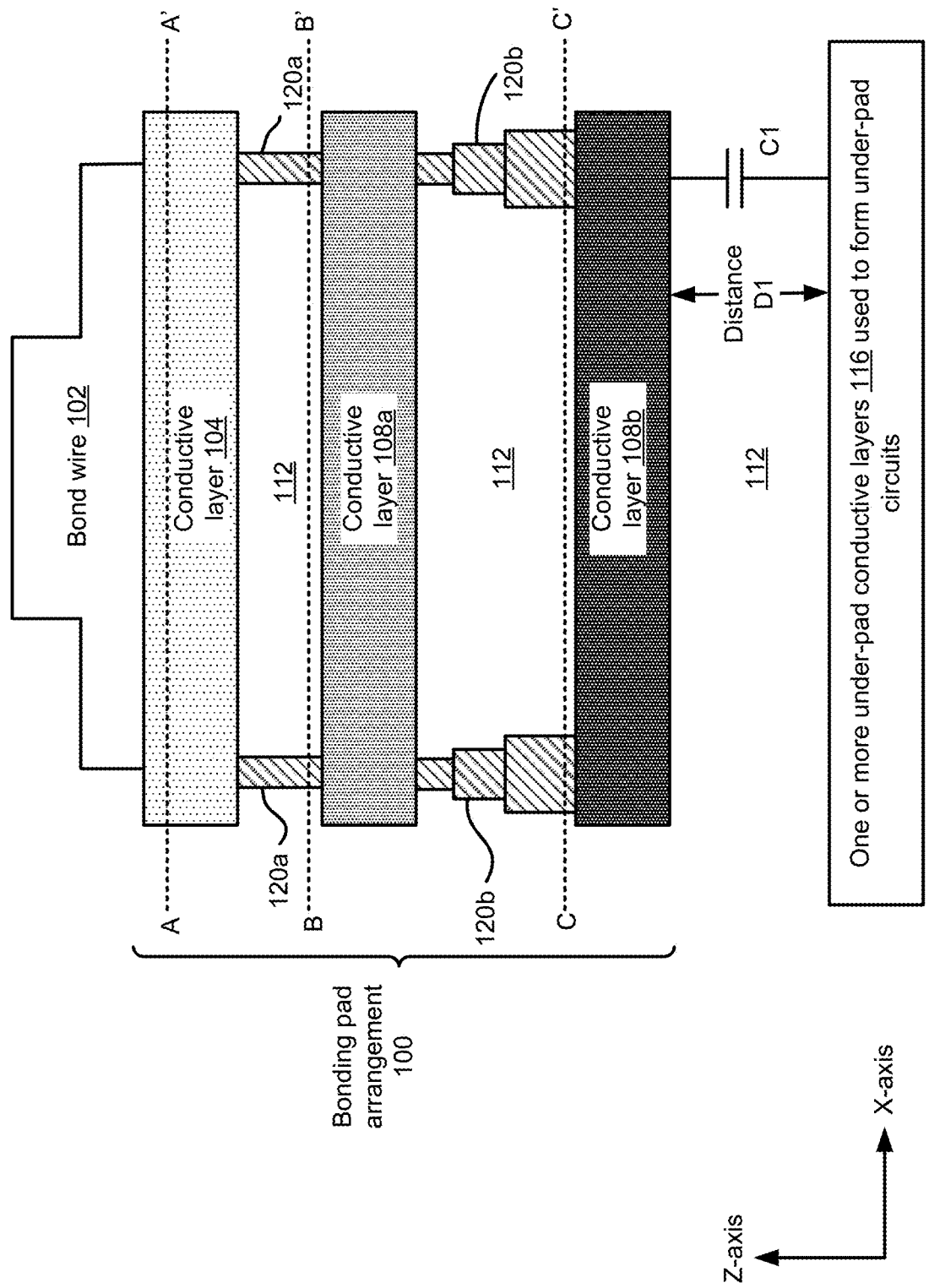

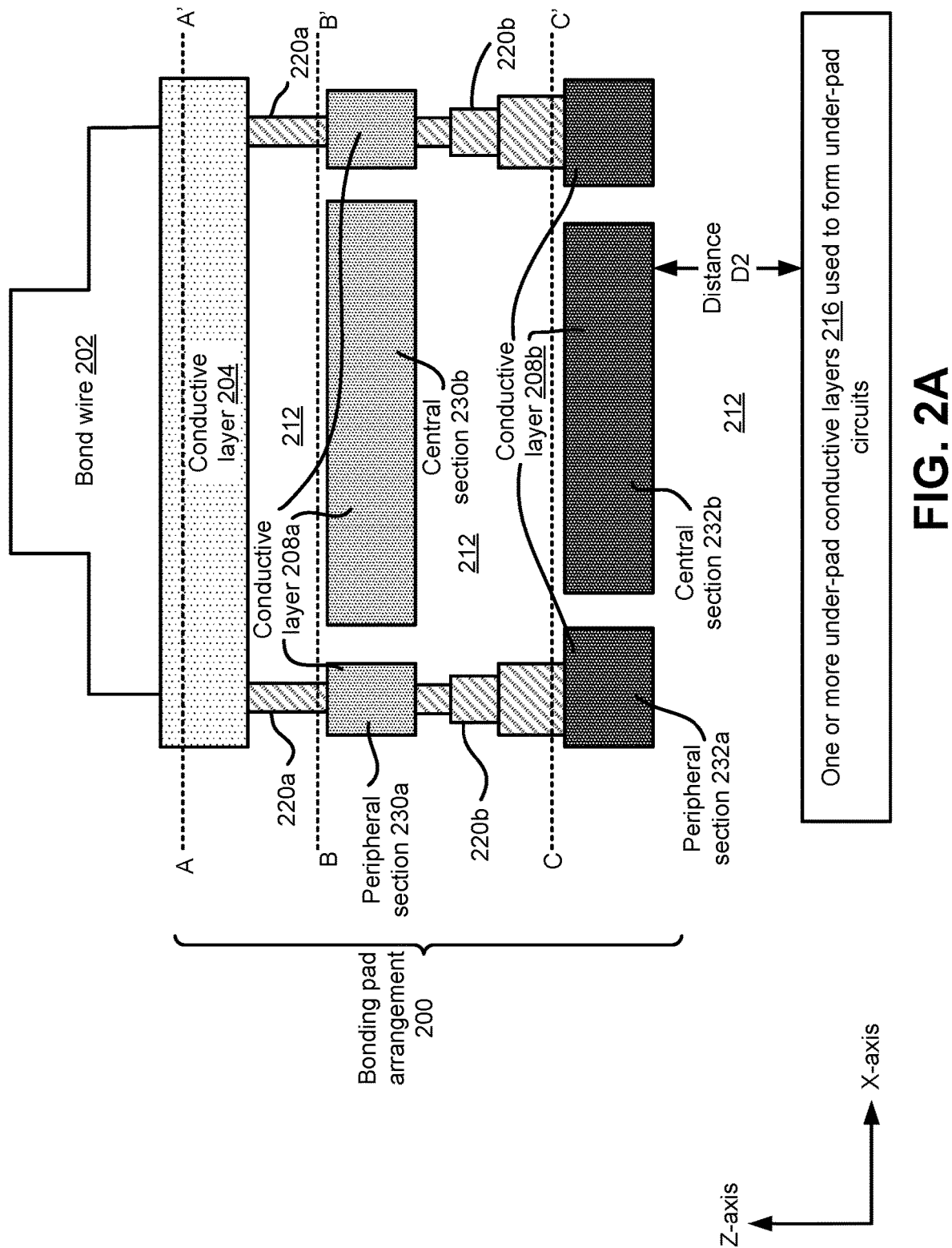

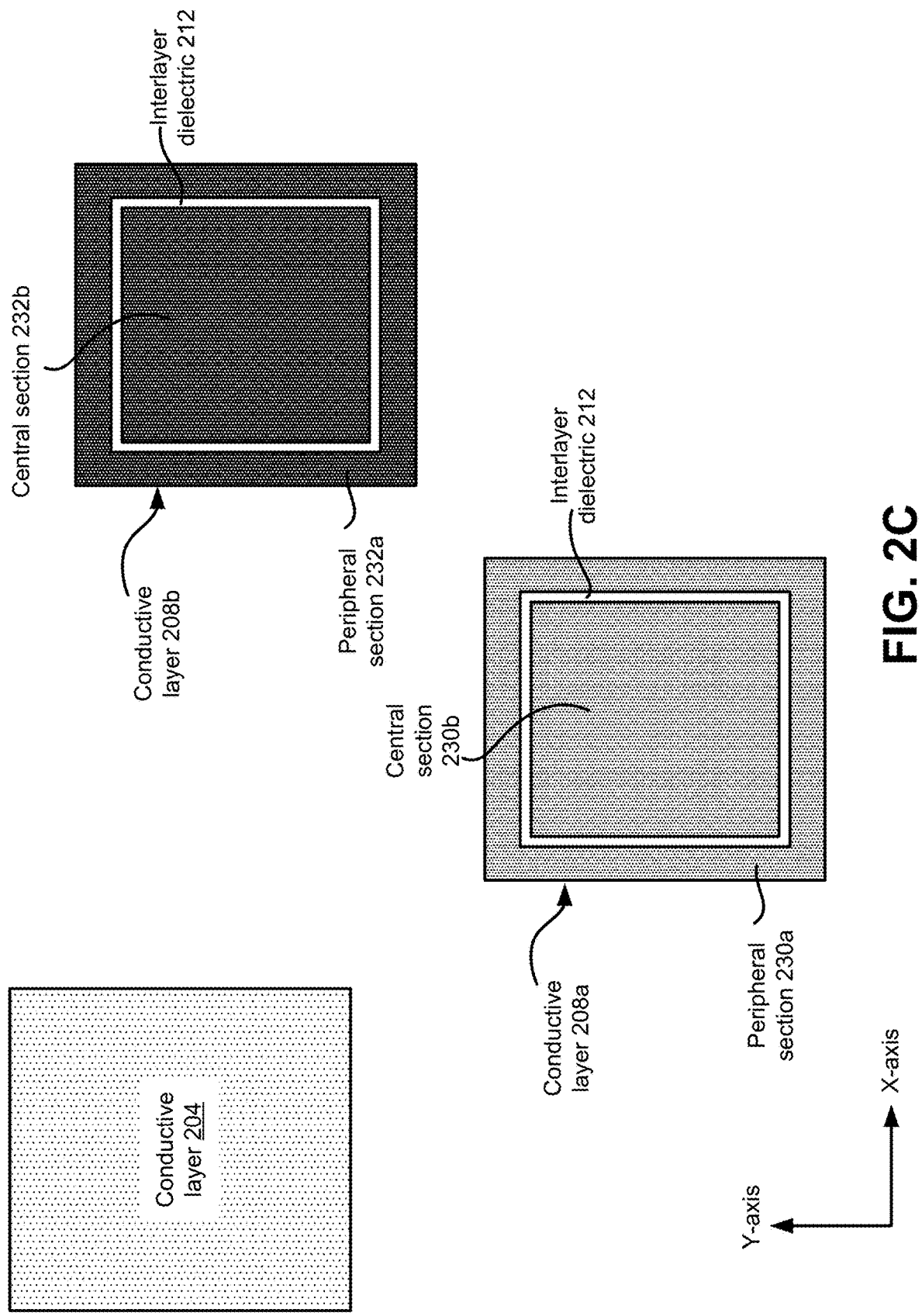

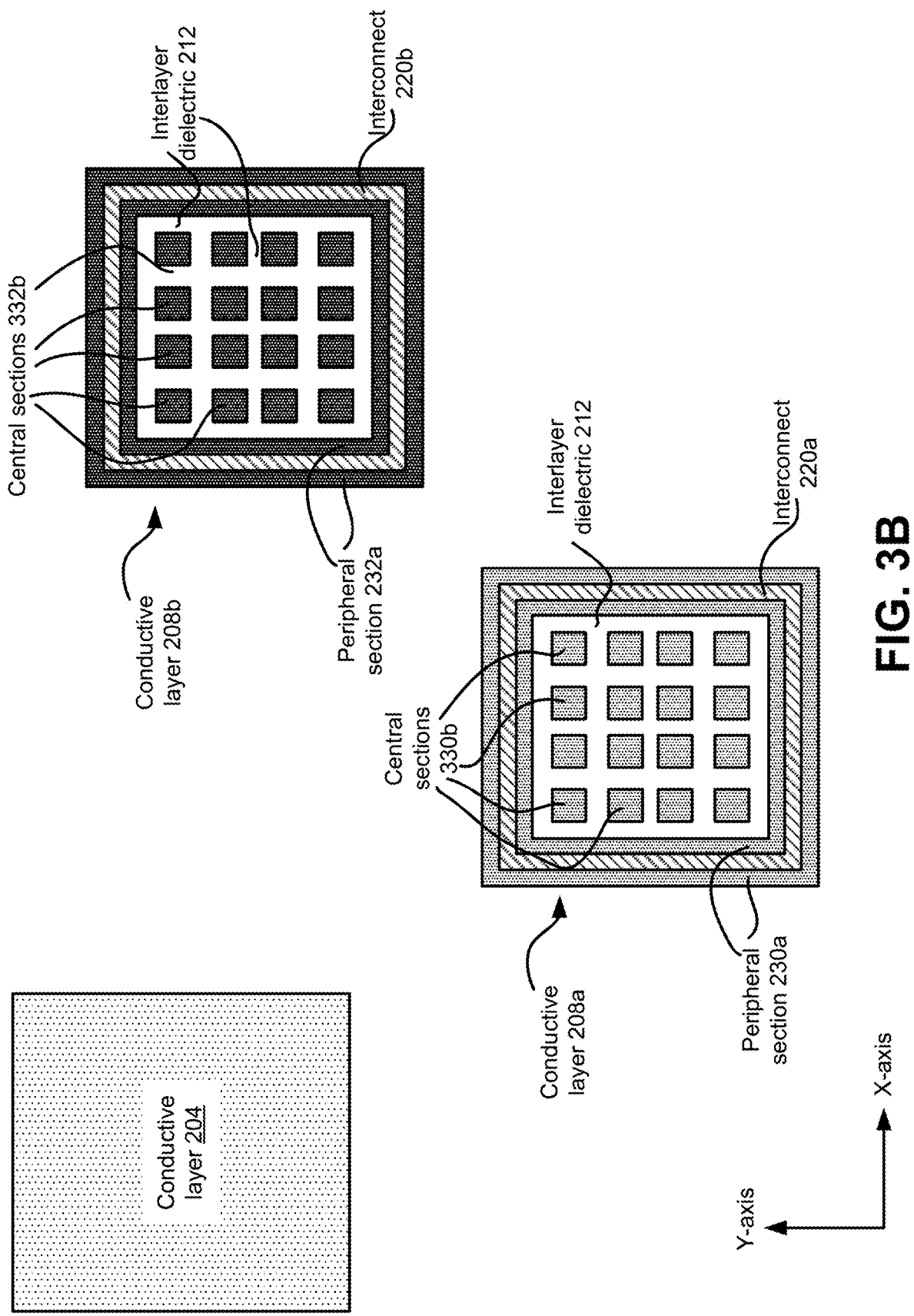

BOND PAD LAYOUT INCLUDING FLOATING CONDUCTIVE SECTIONS

BACKGROUND

Field

The present invention relates to integrated circuits, and specifically to bonding pads for integrated circuits.

Description of Related Art

An integrated circuit package may include an array of bonding pads that provide an electrical connection from outside the integrated circuit to circuit components inside the integrated circuit. FIG. 1A illustrates a cross-sectional view of a bonding pad arrangement 100, and FIG. 1B illustrates a top view of at least some of the components of the bonding pad arrangement 100 of FIG. 1A. Referring to FIG. 1A, a bond wire 102 is coupled to a top surface of a conductive layer 104 of the bonding pad arrangement 100, where the conductive layer 104 comprises an appropriate metal or other conductive material such as polysilicon. The conductive layer 104 is electrically coupled to another conductive layer 108a via one or more corresponding conductive interconnects 120a comprising conductive material. The conductive layer 108a is electrically coupled to another conductive layer 108b via one or more corresponding conductive interconnects 120b comprising conductive material.

FIG. 1B illustrates top views of the conductive layers 104, 108a, and 108b, along lines A-A', B-B', and C-C', respectively, of the cross-sectional view of FIG. 1A. As illustrated in FIGS. 1A and 1B, the conductive layer 104 is a continuous layer of conductive material. Similarly, the conductive layer 108a is a continuous layer of conductive material, with the interconnects 120a coupled along a periphery of a top surface of the conductive layer 108a. Similarly, the conductive layer 108b is a continuous layer of conductive material, with the interconnects 120b coupled along a periphery of a top surface of the conductive layer 108b. In FIG. 1A, the bonding pad arrangement 100 comprises the conductive layers 104, 108a, 108b, and the interconnects 120a, 120b.

FIG. 1A also symbolically illustrates one or more under-pad conductive layers 116 used to form under-pad circuits, such as one or more active devices (such as transistors) and/or passive devices (such as resistors). In an example, the under-pad conductive layers 116 are separated from the bottom-most conductive layer 108b of the bonding arrangement 100 by interlayer dielectric material 112. The interlayer dielectric material 112 also separates the conductive layers 104, 108a, 108b from each other, as illustrated.

In an example, because the bond wire 102 needs a relatively large area for supporting and alignment, the conductive layer 104 usually has a relatively large area of conductive material (e.g., large enough to cause parasitic capacitance in the bonding pad arrangement 100, as will be discussed here). That is, the surface area of the conductive layer 104 cannot be reduced beyond a threshold area, as any decrease of the area of the conductive layer 104 beyond the threshold area may result in less surface area available to bond the bond wire 102 and resultant poor bond quality.

Furthermore, one or more conductive layers 108a, 108b are present in this example between the top conductive layer 104 and the under-pad conductive layers 116, e.g., to reduce mechanical stress and resultant stress damage during a wire bonding process to couple the bond wire 102 to a top surface of the conductive layer 104. For example, the conductive layers 108a, 108b can act as a buffer, to dampen propagation of mechanical stress of the wire bonding process to the under-pad circuits, thus preventing damage to the under-pad circuits during the wire bonding process.

In an example, the relatively large area of the conductive layers 104, 108a, 108b of the bonding pad arrangement 100 may result in a large loading of parasitic capacitance. As illustrated in FIG. 1A, the conductive layers 104, 108a, 108b are electrically coupled to each other via the interconnects 120a, 120b. Note that the bond wire 102 and the conductive layers 104, 108a, 108b are electrically the same node.

In an example, a capacitive loading experienced by signals on the bond wire 102 is a capacitive loading between the bottom-most conductive layer 108b of the bonding arrangement 100 and the under-pad conductive layers 116 (e.g., as the bond wire 102 and the conductive layers 104, 108a, 108b are electrically coupled and electrically a same node). Thus, a parasitic capacitance $C_{parasitic}$ experienced by signals transmitted by the bond wire 102 is a capacitance C1 between the bottom-most conductive layer 108b of the bonding arrangement 100 and the under-pad conductive layers 116, which can be expressed as:

$$C_{parasitic} = C1 = \varepsilon \cdot (A/D1), \qquad \text{Equation 1}$$

where $\varepsilon$ is the absolute permittivity of the interlayer dielectric material 112, D1 is the distance between the conductive layers 108b and 116, and A is the area of the overlapping portion of the conductive layers 108b and 116. Note that the overlapping area A of the conductive layers 108b and 116 is relatively large (e.g., compared to other bonding arrangements discussed herein later), and accordingly, the capacitance C1 is relatively large. This results in degradation of signals transmitted by the boding wire 102. The signal degradation is worse for especially in high-speed applications.

It is desirable to decrease parasitic capacitance experienced by the signals transmitted via the bond wire 102, without decreasing an area of the top-most conductive layer 104 (e.g., as any decrease of the area of the conductive layer 104 would result in less surface area available to bond to the bond wire 102) and without decreasing an overall area of the conductive layers 108a, 108b (e.g., as any such decrease of the overall area of the conductive layers 108a, 108b may result in propagation of mechanical stress of the bonding process to the under-pad circuits).

SUMMARY

The present invention provides a bonding pad arrangement that includes one or more intermediate conductive layers between a top conductive bonding pad layer and under-pad circuits, where individual intermediate conductive layer is sectioned into one or more conductive sections and one or more floating sections, to reduce parasitic capacitance experienced by signals transmitted over a bonding wire.

A semiconductor device is disclosed herein, which includes a first layer comprising conductive material, wherein the first layer is a bonding pad layer. The semiconductor device further includes a second layer comprising conductive material underneath the first layer, and one or more interconnects to couple the second layer to the first layer. In an example, the second layer comprises a plurality of discontinuous sections that includes (i) a connected section coupled to the one or more interconnects and (ii) one or more floating sections that are at least in part surrounded by the connected section. The semiconductor device also includes an under-pad circuit on a substrate underneath the second layer, the under-pad circuit to transmit signals to one or more components external to the semiconductor device though the first layer.

Also disclosed herein is a bonding pad arrangement to transmit signal to and from under-pad circuits, the bonding pad arrangement comprising a top layer comprising conductive material; a bond wire bonded to a top surface of the top layer; and an intermediate layer comprising conductive material, the intermediate layer between the top layer and the under-pad circuits. In an example, the intermediate layer has (i) a first section to transmit signals between the top layer and the under-pad circuits and (ii) a second section that is electrically floating. The bonding pad arrangement further comprises an interconnect electrically coupling the first section of the intermediate layer to the top layer.

Also disclosed herein is a semiconductor device comprising a first conductive layer comprising (i) one or more floating conductive sections that are electrically floating and (ii) a connected conductive section, wherein the one or more of floating conductive sections and the connected conductive section are coplanar. The semiconductor device further includes a second conductive layer above the first conductive layer, the second conductive layer electrically coupled to the connected conductive section of the first conductive layer. A bond wire is bonded to an upper section of the second conductive layer.

Other aspects and advantages of the present invention can be seen on review of the drawings, the detailed description and the claims, which follow.

BRIEF DESCRIPTION OF THE DRAWINGS

FIG. 1A illustrates a cross-sectional view of a bonding pad arrangement.

FIG. 2A illustrates a cross-sectional view of a bonding pad arrangement in which at least one intermediate conductive layer is sectioned in a corresponding peripheral section and a corresponding central section, which results in reduction of parasitic capacitance experienced by signals transmitted via a bond wire.

FIGS. 2B and 2C illustrate top views of at least some of the components of the bonding pad arrangement of FIG. 2A.

FIGS. 3B and 3C illustrate top views of at least some of the components of the bonding pad arrangement of FIG. 3A.

DETAILED DESCRIPTION

Figure 2B:
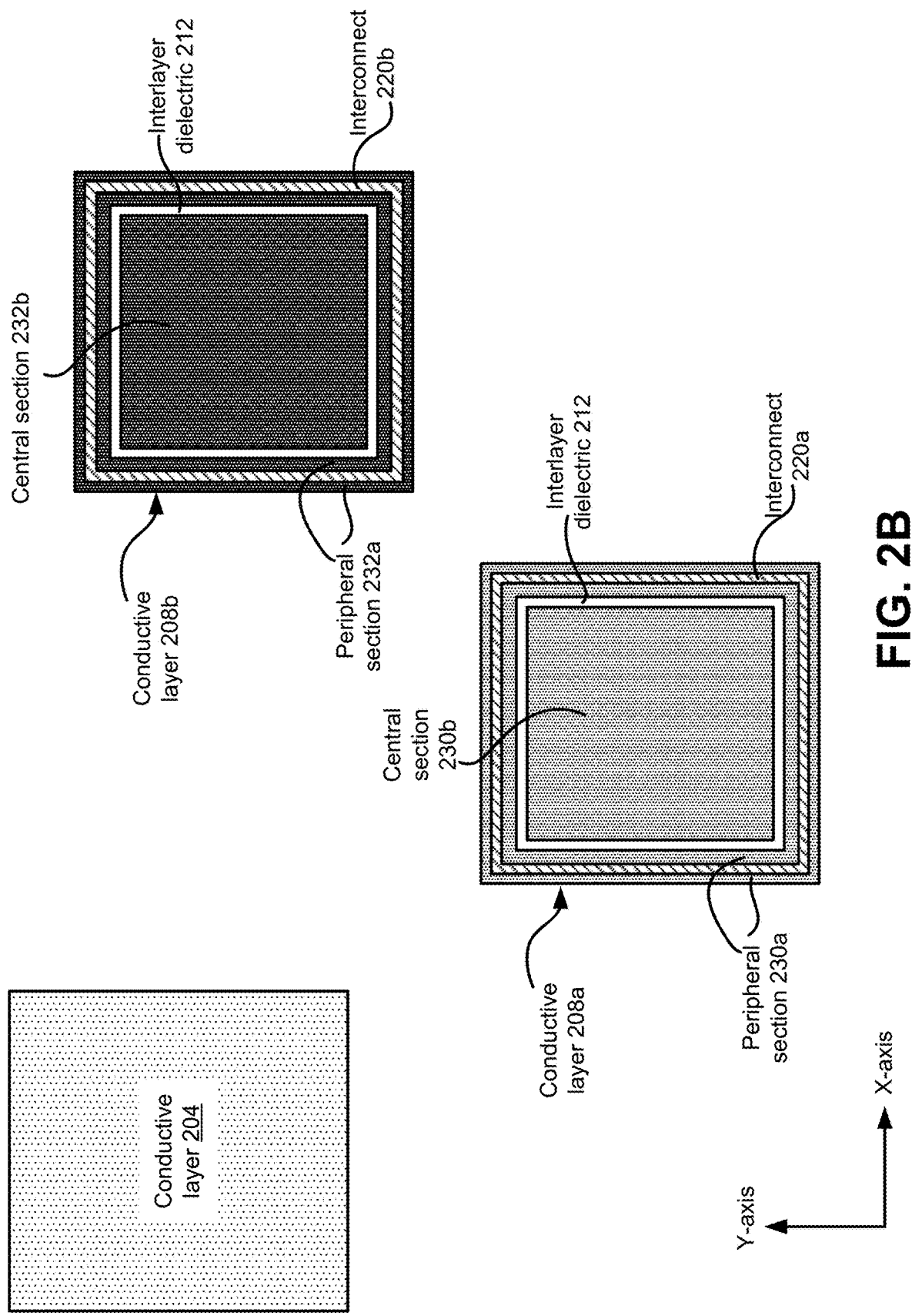

FIG. 2A illustrates a cross-sectional view of a bonding pad arrangement 200 in which at least one intermediate conductive layer is sectioned in one peripheral section and one central section, which results in reduction of parasitic capacitance experienced by signals transmitted via a bond wire. FIGS. 2B and 2C illustrate top views of at least some of the components of the bonding pad arrangement 200 of FIG. 2A.

The bonding arrangement 200 (or other bonding arrangements discussed herein later) can be incorporated in any IC packages and semiconductor devices that include bonding wires and bonding pads (e.g., see FIG. 5). The bonding arrangement 200 can be used to communicate signals between the IC and outside components (such as pins of a circuit board). Example ICs where the bonding arrangements disclosed herein can be used include memories (such as flash memories, Dynamic Random Access Memory (DRAM), etc.), logic devices such as microcontrollers, and/or any IC including bonding wires and bonding pads.

Referring to FIG. 2A, a bond wire 202 is bonded to a conductive layer 204 of the bonding pad arrangement 200. In an example, the bond wire 202 comprises an appropriate metal, such as gold, aluminum, silver, copper, alloys thereof, and/or the like. The bond wire 202 is used to interconnect an integrated circuit (IC) to one or more components outside the IC, such as external pins on a circuit board. The bonding arrangement 200 couples the bond wire 202 to internal conductive layers and circuits (such as under-pad circuits 216) of the IC. Although the bond wire 202 in FIG. 2A is symbolically illustrated to have a shape that is a combination of two rectangles, such as shape of the bond wire 202 is merely for illustrative purposes, and in practical implementation the bond wire 202 is likely to take a different shape, as would be readily appreciated by those skilled in the art.

Although FIG. 2A and various other figures illustrate the bond wire 202 coupled to the conductive layer 204, the arrangement 200 can be used for other purposes as well, such as a ball grid array arrangement. In an example, a ball grid contact, such as a solder ball or a solder bump (e.g., instead of the bond wire 202), can be soldered to a top surface of the conductive layer 204. Various examples and embodiments discussed in this disclosure with respect to a bonding pad arrangement can be applied instead to an arrangement in which a solder ball or a solder bump is soldered to the top conductive layer (e.g., instead of the bond wire 202).

As illustrated in FIG. 2A, the bond wire 202 is wire bonded to a top surface of the conductive layer 204, e.g., using an appropriate wire-bonding process. The conductive layer 204 comprise electrically conductive material, e.g., a metal, such as aluminum, gold, copper, silver, nickel, alloys thereof, and/or the like. The electrically conductive material of the conductive layer 204 may additionally, or alternatively, include polysilicon and/or other non-metallic conductive material. The conductive layer 204 is also referred to herein as a top conductive layer, because of its position relative to other conductive layers discussed herein.

The conductive layer 204 is electrically coupled to another conductive layer 208a underneath the conductive layer 204, via one or more corresponding electrically conductive interconnects 220a. Similarly, the conductive layer 208a is electrically coupled to another conductive layer 208b underneath the conductive layer 208a, via one or more corresponding electrically conductive interconnects 220b. In an example, the conductive layers 208a, 208b and the interconnects 220a, 220b comprise electrically conductive material that may be same as, or different from, the conductive materials discussed with respect to the conductive layer 204.

The conductive layers 208a, 208b are also referred to herein as intermediate conductive layers, because of their relative positions with respect to other conductive layers discussed herein. For example, the conductive layer 204 is above the intermediate conductive layers, and one or more under-pad conductive layers 216 are below the intermediate conductive layers. For the purposes of description, the one element is "above" another element in this context when the one element is relatively closer to the bond wire 202 than the other element.

FIG. 2A also symbolically illustrates the one or more under-pad conductive layers 216 used to form under-pad circuits that includes one or more active devices (such as transistors) and/or passive devices (such as resistors), although the circuits and the active and/or passive devices are not separately illustrated in FIG. 2A. In an example, the under-pad circuits are formed on a substrate (not illustrated in in FIG. 2A) underneath the intermediate conductive layers. One or more under-pad circuits transmit signals to one or more external (e.g., external to the illustrated semiconductor device) though the intermediate conductive layers, the top-most conductive layer 204, and the bond wire 202.

Merely as an example, the under-pad conductive layers 216 are metallization layers 1 and 2 of the IC, the conductive layer 208b is a metallization layer 3 of the IC, the conductive layer 208a is a metallization layer 4 of the IC, and the conductive layer 204 is a metallization layer 5 of the IC. In an example, the metallization layers 1 and 2 are used for interconnections of the under-pad circuits that are underneath the bonding pad arrangement 200.

In an example, the intermediate conductive layers 208a and 208b are placed between the top-most conductive layer 204 and the under-pad conductive layers 216, e.g., to avoid mechanical stress and resultant stress damage to the under-pad circuits during a wire bonding process to couple the bond wire 202 to the top surface of the conductive layer 204. Thus, the intermediate conductive layers 208a and 208b act as buffers between the top-most conductive layer 204 and the under-pad conductive layers 216, to reduce propagation of mechanical stress from the wire bonding region to the under-pad circuits, e.g., during the wire bonding process to bond the bond wire 202 to the conductive layer 204.

In the example of FIG. 2A, two intermediate conductive layers 208a and 208b are placed between the top-most conductive layer 204 and the under-pad conductive layers 216. However, in another example, any different number of conductive layers may be present between the top-most conductive layer 204 and the under-pad conductive layers 216, such as one, three, or higher number of intermediate conductive layers, e.g., depending on a number of metallization layers in the IC and/or depending on the mechanical stress generated during the wire bonding process. Merely as an example, a single intermediate conductive layer may be used. In such an example, metallization layers 1, 2, and 3 may be used for the under-pad circuits, metallization layer 4 may be used for a single intermediate layer 208, and metallization layer 5 may be used for the top-most conductive layer 204. Any other combination, including usage of a higher number of metal layers, may also be possible. Merely as an example, there may be 10 or higher number (or another appropriate number) of metal layers present, with first one or more metal layers used for under-pad circuits, second one or more metal layers used for the intermediate conductive layer(s) 208, and third single metal layer used for the top-most conductive layer 204. As discussed herein, the second one or more metal layers used for the intermediate layer(s) 208 may be between (i) the first one or more metal layers used for under-pad circuits and (ii) the third single metal layer used for the top-most conductive layer 204. As also discussed herein, the intermediate conductive layer(s) 208 may include a single layer, two layers, or a higher number of layers. In an example, a number of layers in the intermediate conductive layer(s) 208 depends on a total number of patterned metal layers present.

In an example, the under-pad conductive layers 216 are separated from the bottom-most intermediate conductive layer 208b of the bonding arrangement 200 by interlayer dielectric material 212 comprising any appropriate dielectric material. The interlayer dielectric material 212 also separates the conductive layers 204, 208a, 208b from each other, as illustrated.

As mentioned earlier, FIGS. 2B and 2C illustrate top views of at least some of the components of the bonding pad arrangement 200 of FIG. 2A. For example, FIG. 2B illustrates top views of the conductive layers 204, 208a, and 208b, along lines A-A', B-B', and C-C', respectively, of the cross-sectional view of FIG. 2A. FIG. 2C illustrates top views of the conductive layers 204, 208a, and 208b, without the corresponding interconnects 220a, 220b. Thus, while the interconnects 220a, 220b are illustrated in the top views of FIG. 2B, the interconnects 220a, 220b are not illustrated in the top views of FIG. 2C.

In an embodiment, each of the conductive layers 208a, 208b comprises a plurality of disjoint or disconnected (or separated) sections. For example, referring to FIGS. 2A, 2B, and 2C, the conductive layer 208a includes at least a peripheral section 230a coupled to the interconnects 220a, 220b. For example, FIGS. 2A and 2B illustrate the interconnects 220a coupled to a top surface of the peripheral section 230a. Although not illustrated in FIG. 2B but illustrated in FIG. 2A, the interconnects 220b are coupled to a bottom surface of the peripheral section 230a of the conductive layer 208a. In the example of FIG. 2B, the interconnects 220a are arranged around a closed loop, along the peripheral section 230a of the conductive layer 208a. The interconnects 220a are arranged around a perimeter of the peripheral section 230a of the conductive layer 208a. Because the peripheral section 230a of the conductive layer 208a is coupled to the bond wire and the under-pad circuits via the interconnects 220a, 220b, the peripheral section 230a is also referred to as a connected conductive section of the conductive layer 208a.

In an example, individual ones of the interconnects 220a, 220b may correspond to an element of a patterned metal layer or to a via formed between interconnection of different patterned metal layers. For example, the interconnection 220b is a conductive via formed between patterned metal layers 208a and 208b.

As illustrated in the cross-sectional view of FIG. 2A and the top-view of FIG. 2B, in an example, the interconnect 220a has a cylindrical shape. For example, the interconnect 220a comprises a cylinder having a rectangular cross section (e.g., the rectangular top view illustrated in FIG. 2B), although in some other examples the cylindrical shape of the interconnect 220a can have an oval, a circular cross-section (or with a cross-section having another shape). The interconnect 220b can have a cylindrical shape as well, e.g., as discussed with respect to the interconnect 220a.

In an example, the top conductive layer 204 has a perimeter. The peripheral section 230a underlay the top layer near the perimeter of the top layer. For example, imagine a cylinder (also referred to as perimeter cylinder) defined by projection of the perimeter of the top layer, along an axis perpendicular to the top conductive layer 204. The peripheral section 230a of the intermediate layer 208a is within, or intersected by, such a perimeter cylinder of the top conductive layer 204. The interconnects 220a can be positioned relative to the cylinder, in an example. For example, the interconnects 220a form an interconnect cylinder that coincides with, is within, or intersected by the perimeter cylinder of the top conductive layer 204.

The conductive layer 208a further includes a central section 230b. The peripheral section 230a is separated from the central section 230b by interlayer dielectric 212. Thus, the peripheral section 230a and the central section 230b are disjoint or discontinuous sections of the conductive layer 208a, and are electrically isolated from each other. Note that both the peripheral section 230a and the central section 230b are formed from the same conductive layer (e.g., same metallization layer 4), and hence, are coplanar and lie in the same plane. Thus, both the peripheral section 230a and the central section 230b are from a single patterned metal layer. For example, a top surface of the peripheral section 230a and a top surface of the central section 230b are on a same plane, and a bottom surface of the peripheral section 230a and a bottom surface of the central section 230b are on a same plane. In an example, the peripheral section 230a forms a closed loop around the central section 230b. The central section 230b is electrically isolated from the peripheral section 230a, e.g., by the interlayer dielectric 212. The central section 230b is not electrically coupled to any circuit element of the IC (except for capacitive coupling with other conductive layers, as will be discussed herein). Thus, the central section 230b is electrically isolated and floating. Accordingly, the central section 230b is also referred to as a floating conductive section of the conductive layer 208a.

In an example, an area of the central section 230b is at least a threshold percentage of an overall area of the conductive layer 208a. In an example, the area of the central section 230b is at least a threshold percentage of an area of a continuous section of the conductive layer 204 to which the bond wire 202 is bonded. In an example, the threshold percentage is 50%, 60%, or the like. Making the area of the central section 230b larger with respect to the overall area of the conductive layer 208a reduces overall parasitic capacitance, as will be discussed herein.

Similarly, in an example and referring to FIGS. 2A, 2B, and 2C, the conductive layer 208b includes at least a peripheral section 232a coupled to the interconnects 220b. The conductive layer 208b further includes a central section 232b. In the example of FIG. 2B, the interconnects 220b are arranged around a closed loop, along the peripheral section 232a of the conductive layer 208b. The interconnects 220b are arranged around a perimeter of the peripheral section 232a of the conductive layer 208b. The peripheral section 232a is separated from the central section 232b by interlayer dielectric 212. Thus, the peripheral section 232a and the central section 232b are disjoint or discontinuous sections of the conductive layer 208b. Note that both the peripheral section 232a and the central section 232b are formed from the same conductive layer (e.g., same metallization layer 3), and hence, are coplanar and lie in the same plane. For example, a top surface of the peripheral section 232a and a top surface of the central section 232b are on a same plane, and a bottom surface of the peripheral section 232a and a bottom surface of the central section 232b are on a same plane. In an example, the peripheral section 232a forms a closed loop around the central section 232b. The central section 232b is electrically isolated from the peripheral section 232a, e.g., by the interlayer dielectric 212. The central section 232b is not electrically coupled to any circuit element of the IC (except for capacitive coupling with other conductive layers, as will be discussed herein). Thus, the central section 232b is electrically isolated and floating.

Although not illustrated in FIGS. 2A, the peripheral section 232a of the conductive layer 208b (e.g., a bottom surface of the peripheral section 232a) is electrically coupled to one or more under-pad circuits via one or more corresponding interconnects. Because the peripheral section 232a of the conductive layer 208b is coupled to the bond wire 202 and the under-pad circuits via the interconnects 220a, 220b, the peripheral section 232a is also referred to as a connected conductive section of the conductive layer 208b. Also, the central section 232b is referred to as a floating conductive section of the conductive layer 208b, as the central section 232b is electrically floating and isolated from rest of the components of the IC.

In an example, an area of the central section 232b is at least a threshold percentage of an overall area of the conductive layer 208b. In an example, the area of the central section 232b is at least a threshold percentage of an area of a continuous section of the conductive layer 204 to which the bond wire 202 is bonded. In an example, the threshold percentage is 50%, 60%, or the like. Making the area of the central section 232b larger with respect to the overall area of the conductive layer 208b reduces overall parasitic capacitance, as will be discussed herein.

The peripheral sections 230a, 232a of the conductive layers 208a, 208b, respectively, and the interconnects 220a, 220b transmit signals between the bond wire 202 and internal circuits of the IC (e.g., the under-pad conductive layers 216). The central sections 230b, 232b of the conductive layers 208a, 208b, respectively, do not have any role in transmission of such signals, and hence, can be kept floating and isolated from the respective peripheral sections. The central sections 230b, 232b avoids propagation of mechanical stress from the top-most conductive layer 204 to the under-pad circuits, during the wire bonding process, as discussed herein previously. Keeping the central sections 230b, 232b floating helps reduce parasitic capacitance, as discussed herein with respect to FIG. 2D.

Figure 2D:
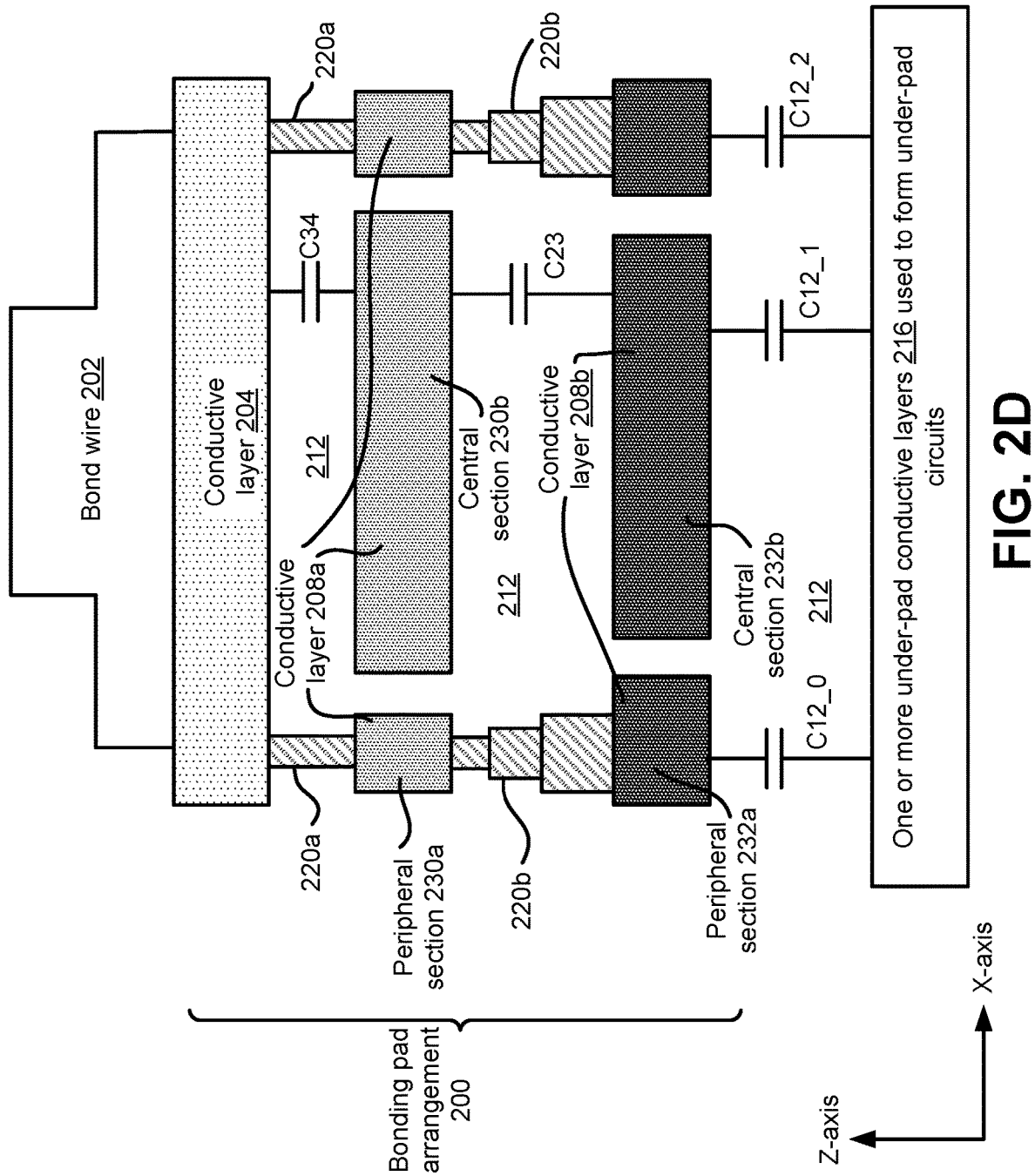
FIG. 2D illustrates parasitic capacitance between various sections of various conductive layers of the bonding pad arrangement of FIGS. 2A-2C.

FIG. 2D illustrates parasitic capacitance between various sections of various conductive layers of the bonding pad arrangement 200 of FIGS. 2A-2C. Note that the peripheral sections 230a, 232a of the conductive layers 208a, 208b, respectively, and the conductive layer 204 are electrically coupled and in essence, act as a single electrical node. Parasitic capacitance C12_0 and C12_2 may be generated between this electrical node and the under-pad conductive layers 216, as illustrated in FIG. 2D. FIG. 2D also illustrates parasitic capacitance C12_1 generated between the central section 232b of the conductive layer 208b and the under-pad conductive layers 216. FIG. 2D further illustrates parasitic capacitance C23 generated between the central sections 230b and 232b of the conductive layers 208a and 208b, respectively. FIG. 2D further illustrates parasitic capacitance C34 generated between the central section 230b of the conductive layer 208a and the conductive layer 204.

Note that the parasitic capacitance C12_0 and C12_2 can be combined as a single capacitance, as there may be a single peripheral section 232a in a closed loop, as illustrated in the top view of FIGS. 2B and 2C. Moreover, the parasitic capacitance C12_0 and C12_2 would be relatively small, owing to the relatively small area of the peripheral section 232a (e.g., relative to an area of the entire conductive layer 208b, or relative to the central section 232b), as illustrated in FIGS. 2B and 2C.

Furthermore, the series capacitance between the under-pad conductive layers 216 and the bond wire 202, via the central sections 230b and 232b is given by:

$$C_{SER} = \cfrac{1}{\cfrac{1}{C34} + \cfrac{1}{C23} + \cfrac{1}{C12\_1}} < C12\_1. \quad \text{Equation 2}$$

Thus, total parasitic capacitance between the bond wire 202 and the under-pad conductive layers 216 is given by:

$$C_{parasitic} = C12\_0 + C12\_2 + \cfrac{1}{\cfrac{1}{C34} + \cfrac{1}{C23} + \cfrac{1}{C12\_1}} \quad \text{Equation 3}$$

Figure 1B:
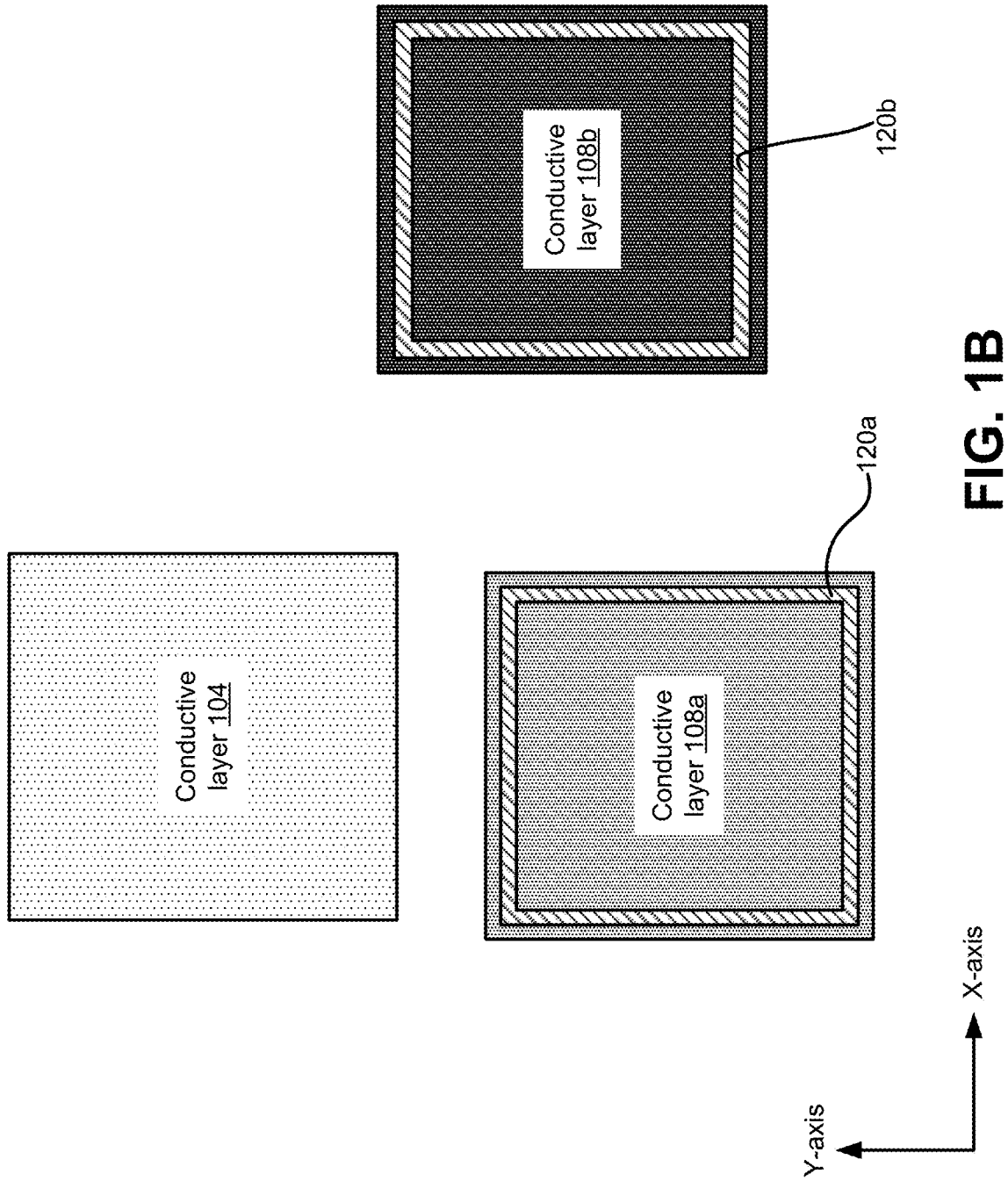
FIG. 1B illustrates a top view of at least some of the components of the bonding pad arrangement of FIG. 1A.

As discussed, the parasitic capacitance C12_0 and C12_2 would be relatively small, owing to the relatively small area of the peripheral section 232a (e.g., relative to an area of the entire conductive layer 208b), as illustrated in FIGS. 2B and 2C. Additionally, $C_{SER}$ is relatively small, as seen in equation 2, and is smaller than C12_1. Thus, the total parasitic capacitance $C_{parasitic}$ of equation 3 between the bond wire 202 and the under-pad conductive layers 216 is relatively small, e.g., compared to the total capacitance C1 of equation 1 for the bonding arrangement 100 of FIG. 1.

Thus, sectioning the intermediate conductive layers 208a, 208b, as illustrated in FIGS. 2A, 2B, and 2C, results in decrease of parasitic capacitance experienced by the bond wire 202. Note that such sectioning of the intermediate conductive layers 208a, 208b does not result in any corresponding decrease or increase in an area of the bonding arrangement, and the area of the bonding arrangement 200 of FIGS. 2A-2C can be same as the area of the bonding arrangement 100 of FIGS. 1A, 1B. Similarly, a distance D2 between the conductive layer 208a and the under-pad conductive layers 216 (see FIG. 2A) can be same as the distance D1 of FIG. 1A. Thus, sectioning the intermediate conductive layers 208a, 208b and keeping the central sections 230b, 232b electrically isolated and floating results in decrease of parasitic capacitance experienced by the bond wire 202, without any corresponding decrease or increase in the area of the bonding arrangement 200. Reducing the parasitic capacitance, by keeping the central sections 230b, 232b of the intermediate conductive layers 208a, 208b floating, in turn results in reduction of loading of the bond wire 202 and the bonding pad arrangement 200, and better signal quality of signals transmitted by the bond wire 202. This technology enables use of bonding pads with larger available bonding surface for a given parasitic capacitance specification.

Figure 3A:
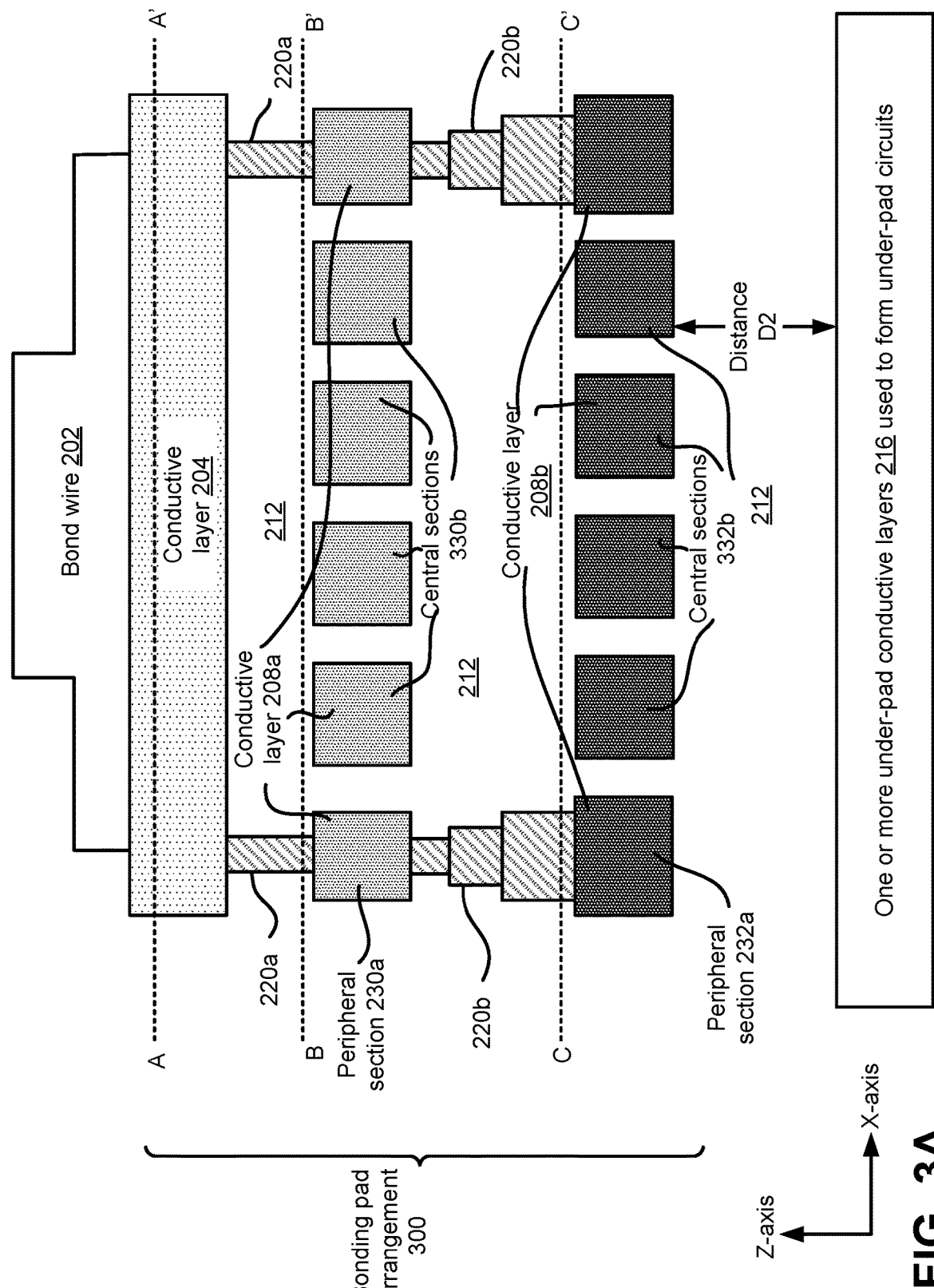
FIG. 3A illustrates a cross-sectional view of a bonding pad arrangement in which at least one intermediate conductive layer is sectioned in a corresponding peripheral section and a plurality of central sections, which results in reduction of parasitic capacitance experienced by signals transmitted via a bond wire.

In FIGS. 2A-2D, the intermediate conductive layers 208a, 208b are sectioned in one peripheral section and one central section. However, in another example, an intermediate conductive layer 208 can be sectioned in one peripheral section and multiple central sections. FIG. 3A illustrates a cross-sectional view of a bonding pad arrangement 300 in which at least one intermediate conductive layer is sectioned in a corresponding peripheral section and a plurality of central sections, which results in reduction of parasitic capacitance experienced by signals transmitted via a bond wire, and FIGS. 3B and 3C illustrate top views of at least some of the components of the bonding pad arrangement 300 of FIG. 3A.

Figure 3C:
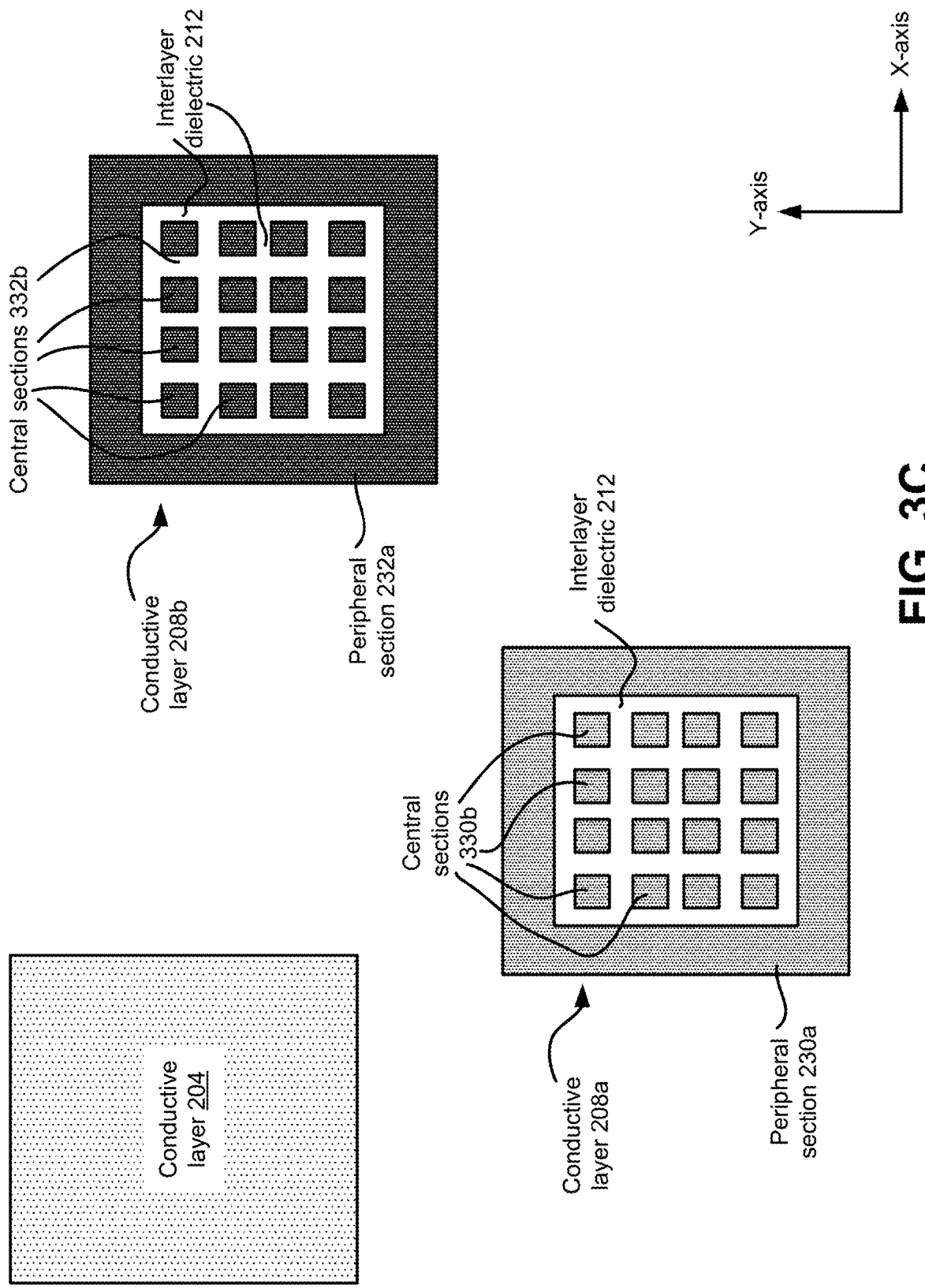

The bonding pad arrangement 300 of FIGS. 3A-3C are at least in part similar to the bonding pad arrangement 200 of FIGS. 2A-2C, and like components in these two sets of figures are labelled using the same labels. For example, similar to the bonding pad arrangement 200 of FIGS. 2A-2C, the bonding pad arrangement 300 of FIGS. 3A-3C includes the conductive layers 204, 208a, 208b and interconnects 220a, 220b. Also, similar to FIG. 2A, in FIG. 3A the bond wire 202 is coupled to the top surface of the conductive layer 204, and one or more under-pad conductive layers 216 are used to form under-pad circuits. Also, FIG. 3B illustrates top views of the conductive layers 204, 208a, and 208b, along lines A-A', B-B', and C-C', respectively, of the cross-sectional view of FIG. 3A. FIG. 3C illustrates top views of the conductive layers 204, 208a, and 208b, without the corresponding interconnects 220a, 220b. Thus, while the interconnects 220a, 220b are illustrated in the top views of FIG. 3B, the interconnects 220a, 220b are not illustrated in the top views of FIG. 3C.

However, unlike the bonding pad arrangement 200 in which each of the intermediate conductive layers 208a, 208b included a corresponding single central section, in the bonding pad arrangement 300 each of the intermediate conductive layers 208a, 208b includes a corresponding plurality of central sections.

For example, as illustrated in FIGS. 3A, 3B, 3C, the conductive layer 208a is sectioned in a plurality of central sections 330b and one peripheral section 230a. Although each central section 330b is illustrated to have a rectangular or square shape in the top views of FIGS. 3B and 3C, such illustrations do not limit the scope of this disclosure, and individual central section 330b can have any appropriate shape, such as oval, rhombus, an irregular shape, or the like. Each central section 330b is electrically isolated from adjacent central sections (or adjacent peripheral section 230a) by the interlayer dielectric 212. Thus, each central section 330b is electrically floating. Although FIGS. 3B and 3C illustrate a 4×4 array, or 16 total central sections 330b, such a number of central sections 330b is merely an example, and the conductive layer 208a can have any other appropriate number of central sections 330b. Thus, the central section 230b of FIGS. 2A-2C is broken down into multiple central sections 330b (also referred to as central sub-sections 332b, or floating conductive sections) in FIGS. 3A-3C.

In an example, a summation of areas of all the central sections 330b is at least a threshold percentage of an overall area of the conductive layer 208a. In an example, the summation of area is at least a threshold percentage of an area of a continuous section of the conductive layer 204 to which the bond wire 202 is bonded. In an example, the threshold percentage is 50%, 60%, or the like. Making the overall area of the central sections 330b larger with respect to the overall area of the conductive layer 208a reduces overall parasitic capacitance and increases stress tolerance during the bonding process.

In an example, similar to the conductive layer 208a, the conductive layer 208b is sectioned in a plurality of sections 332b and one peripheral section 232a. Although each central section 332b is illustrated to have a rectangular or square shape in the top view of FIGS. 3B and 3C, such illustrations do not limit the scope of this disclosure, and individual central section 332b can have any appropriate shape, such as oval, rhombus, an irregular shape, or the like. Each central section 332b is electrically isolated from adjacent central sections (or adjacent peripheral section 232a) by the interlayer dielectric 212. Thus, each central section 332b is electrically floating. Although FIGS. 3B and 3C illustrate a 4×4 array, or 16 total central sections 332b, such a number of central sections 332b is merely an example, and the conductive layer 208*b* can have any other appropriate number of central sections 332*b*. Thus, the central section 232*b* of FIGS. 2A-2C are broken down into multiple central sections 332*b* (also referred to as central sub-sections 332*b*, or floating conductive sections) in FIGS. 3A-3C.

In an example, a summation of areas of all the central sections 332*b* is at least a threshold percentage of an overall area of the conductive layer 208*a*. In an example, the summation of area is at least a threshold percentage of an area of a continuous section of the conductive layer 204 to which the bond wire 202 is bonded. In an example, the threshold percentage is 50%, 60%, or the like. Making the overall area of the central sections 332*b* larger with respect to the overall area of the conductive layer 208*b* reduces overall parasitic capacitance and increases stress tolerance during the bonding process.

Note that both the peripheral section 230*a* and the central sections 330*b* are formed from the same conductive layer (e.g., same metallization layer 4), and hence, are coplanar and lie in the same plane. In an example, a top surface of the peripheral section 230*a* and top surfaces of the central sections 330*b* are on a same plane, and a bottom surface of the peripheral section 230*a* and bottom surfaces of the central sections 330*b* are on a same plane. Similarly, in an example, a top surface of the peripheral section 232*a* and top surfaces of the central sections 332*b* are on a same plane, and a bottom surface of the peripheral section 232*a* and bottom surfaces of the central sections 332*b* are on a same plane.

Figure 3D:
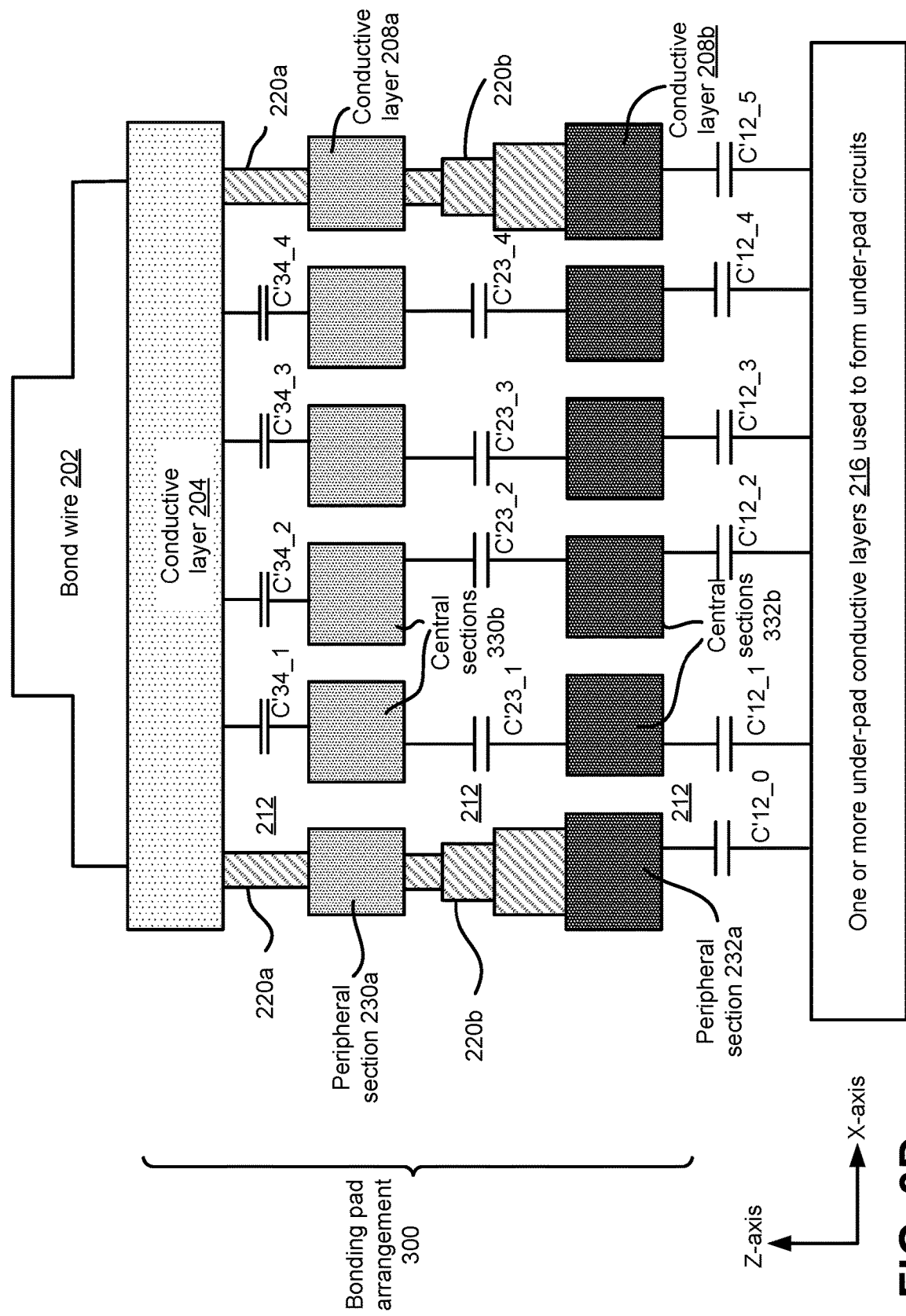
FIG. 3D illustrates parasitic capacitance between various sections of various conductive layers of the bonding pad arrangement of FIGS. 3A-3C.

FIG. 3D illustrates parasitic capacitance between various sections of various conductive layers of the bonding pad arrangement 300 of FIGS. 3A-3C. Note that the peripheral sections 230*a*, 232*a* of the conductive layers 208*a*, 208*b*, respectively, the bond wire 202, and the conductive layer 204 are electrically coupled and in essence, act as a single electrical node. Parasitic capacitance C'12_0 and C'12_5 may be generated between this electrical node and the under-pad conductive layers 216, as illustrated in FIG. 3D. FIG. 3D also illustrates parasitic capacitance C'12_1 generated between a first central section 332*b* of the conductive layer 208*b* and the under-pad conductive layers 216, parasitic capacitance C'12_2 generated between a second central section 332*b* of the conductive layer 208*b* and the under-pad conductive layers 216, and so on. Thus, parasitic capacitance would be generated between each of the 16 central sections 332*b* (see FIGS. 3B and 3C) and the under-pad conductive layers 216.

FIG. 3D also illustrates parasitic capacitance C'23_1 generated between a first central section 332*b* of the conductive layer 208*b* and a first central section 330*b* of the conductive layer 208*a*, parasitic capacitance C'23_2 generated between a second central section 332*b* of the conductive layer 208*b* and a second central section 330*b* of the conductive layer 208*a*, and so on. Thus, parasitic capacitance would be generated between each of the 16 central sections 332*b* (see FIGS. 3B and 3C) and a corresponding central section 330*b*.

FIG. 3D also illustrates parasitic capacitance C'34_1 generated between a first central section 330*b* of the conductive layer 208*a* and the conductive layer 204, parasitic capacitance C'34_2 generated between a second central section 330*b* of the conductive layer 208*a* and the conductive layer 204, and so on. Thus, parasitic capacitance would be generated between each of the 16 central sections 330*b* (see FIGS. 3B and 3C) and the conductive layer 204.

A total parasitic capacitance generated between the bond wire 202 and the under-pad conductive layers 216 is given by:

$$C'_{parasitic} = C'12\_0 + C'12\_5 + \cfrac{1}{\cfrac{1}{C'34\_1} + \cfrac{1}{C'23\_1} + \cfrac{1}{C'12\_1}} + \ldots + \cfrac{1}{\cfrac{1}{C'34\_4} + \cfrac{1}{C'23\_4} + \cfrac{1}{C'12\_4}}$$

Equation 4

As discussed previously with respect to FIG. 2C, the parasitic capacitance C'12_0 and C'12_5 would be relatively small, owing to the relatively small area of the peripheral section 232*a* (e.g., relative to an area of the entire conductive layer 208*b*), as illustrated in FIGS. 3A-3C. Additionally, the remaining fractional term is capacitance of multiple series capacitors, which will also be relatively small. Accordingly, the total parasitic capacitance $C'_{parasitic}$ of equation 4 generated in the boding arrangement 300 of FIGS. 3A-3D would be relatively small, e.g., compared to the total capacitance C1 of equation 1 for the bonding arrangement 100 of FIG. 1. Thus, sectioning the intermediate conductive layers 208*a*, 208*b*, as illustrated in FIGS. 3A-3D, results in decrease of parasitic capacitance experienced by the bond wire 202. Note that such sectioning of the intermediate conductive layers 208*a*, 208*b* does not result in any corresponding increase in an area of the bonding arrangement.

Figure 4:
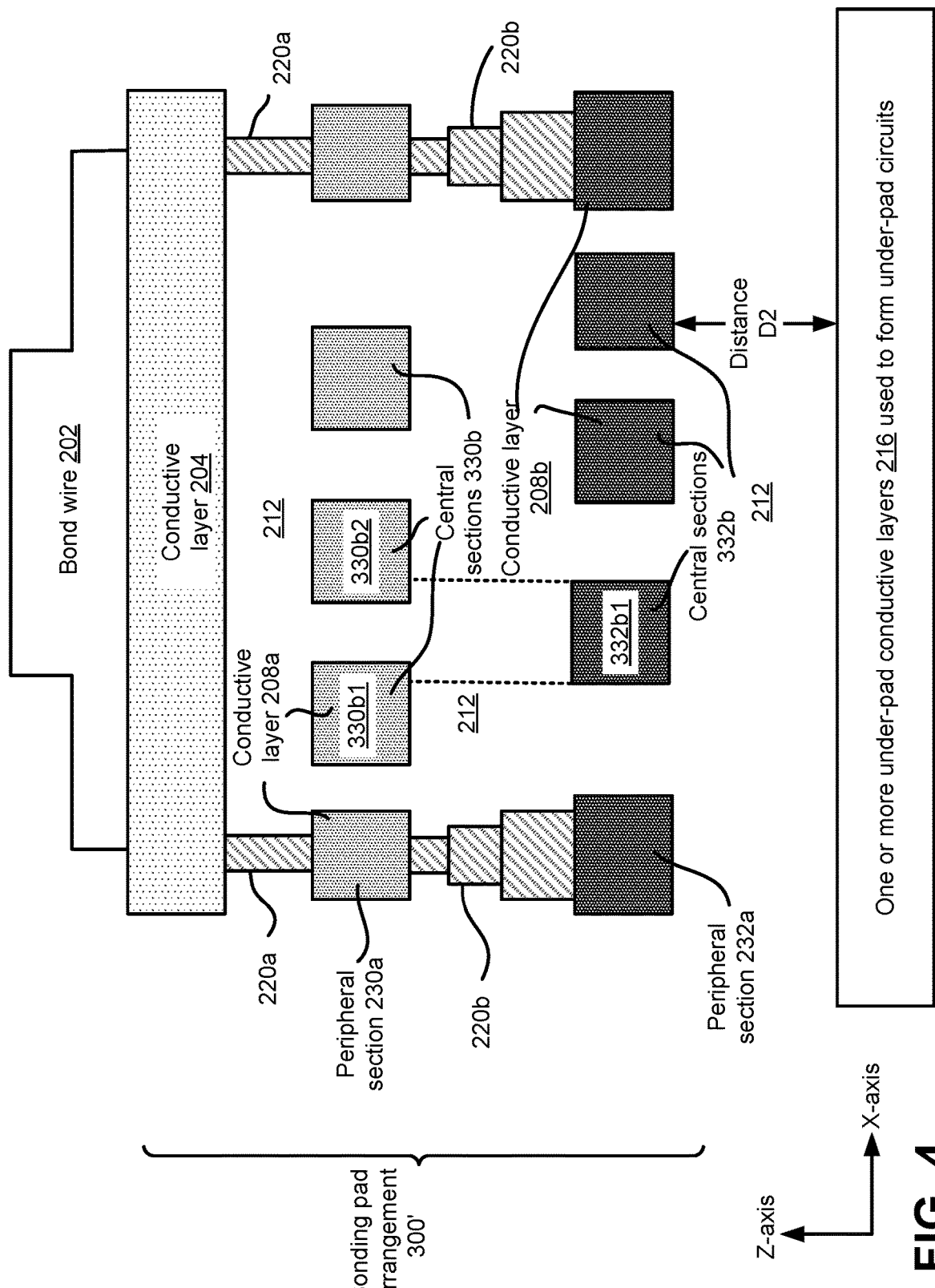
FIG. 4 illustrates a cross-sectional view of a bonding pad arrangement in which central sections of two adjacent intermediate conductive layers are misaligned.

In FIGS. 3A-3D, a central section 330*b* of the conductive layer 208*a* is illustrated to be aligned with a corresponding central section 332*b* of the conductive layer 208*b*. However, in some examples, the central sections 330*b* of the conductive layer 208*a* may not be fully aligned with the central sections 332*b* of the conductive layer 208*b*. FIG. 4 illustrates a cross-sectional view of a bonding pad arrangement 300' in which central sections of two adjacent intermediate conductive layers are misaligned. The bonding pad arrangement 300' of FIG. 4 is similar to the bonding pad arrangement 300 of FIG. 3A, although only three corresponding central sections of each intermediate conductive layers 208*a*, 208*b* are illustrated in FIG. 4 (note that a number of illustrated central sections is merely an example).

Furthermore, in FIG. 4, a specific central section of the conductive layer 208*b* is labelled as 332*b*1, and two specific central sections of the conductive layer 208*a* are labelled as 330*b*1 and 330*b*2. As illustrated, the central section 332*b*1 is not aligned to either of the central sections 330*b*1 and 330*b*2. That is, the central section 332*b*1 is offset with respect to each of the central sections 330*b*1 and 330*b*2. For example, at least a section of the central section 332*b*1 is underneath the central section 330*b*1, and at least another section of the central section 332*b*1 is underneath the central section 330*b*2, as illustrated. Such misalignment of the central sections of the two conductive layers 208*a*, 208*b* further reduces parasitic capacitance, as overlapping area between the central sections 330*b*1 and 332*b*1 further reduces due to the misalignment.

Figure 5:
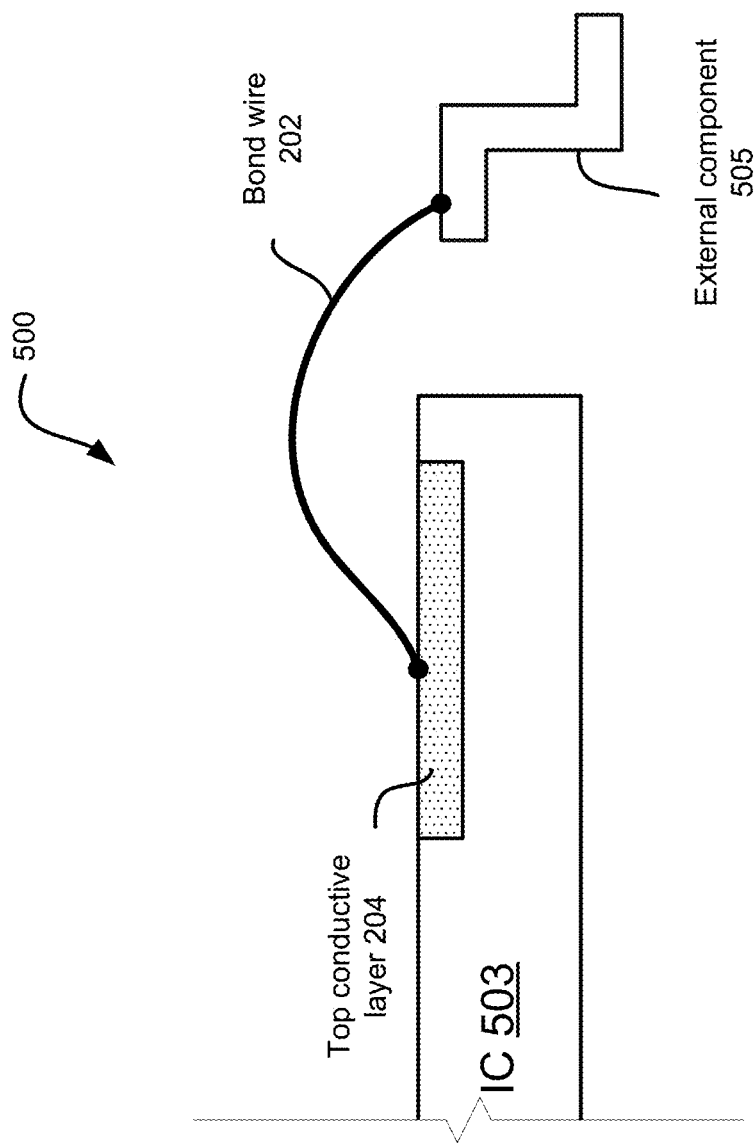
FIG. 5 illustrates a system in which various bonding pad arrangements discussed herein can be utilized.

FIG. 5 illustrates a system 500 in which various bonding pad arrangements discussed herein can be utilized. The system 500 comprises an IC 503 that includes the various bonding pad arrangements discussed herein. For example, the top conductive layer 204 of the various bonding pad arrangements discussed herein is illustrated in FIG. 5. FIG.

5 also illustrates the bond wire 202, a first end of which is bonded to the top conductive layer 204. A second end of the bond wire 202 is coupled to an external component 505, where the external component 505 is external to the IC 503. The bond wire 202 interconnects the under-pad circuits discussed herein with respect to FIGS. 2A-4 to the external component 505. The external component 505 can be any appropriate component, such as another IC, a lead frame, a circuit board, a passive component, and/or the like.

Example of the IC 503, where the bonding arrangements disclosed herein can be used, include memories (such as flash memories, Dynamic Random Access Memory (DRAM), a three dimensional (3D) memory chip, etc.), logic devices such as microcontrollers, and/or any IC including bonding wires and bonding pads.

Although FIG. 5 and various other figures illustrate the bond wire 202 coupled to the conductive layer 204, the bonding pad arrangement discussed herein can be used for other purposes as well, such as for a ball grid array arrangement. In an example, a ball grid contact, such as a solder ball or a solder bump (e.g., instead of the bond wire 202), can be soldered to a top surface of the conductive layer 204. Thus, various examples and embodiments discussed in this disclosure with respect to a bonding pad arrangement can be applied instead to an arrangement in which a solder ball or a solder bump is soldered to the top conductive layer (e.g., instead of the bond wire 202).

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A semiconductor device comprising:
a first layer comprising conductive material, wherein the first layer is a bonding pad layer;
a second layer comprising conductive material underneath the first layer;
one or more interconnects to couple the second layer to the first layer,
wherein the second layer comprises a plurality of discontinuous sections that includes (i) a connected section coupled to the one or more interconnects and (ii) one or more floating sections that are at least in part surrounded by the connected section; and
an under-pad circuit on a substrate underneath the second layer, the under-pad circuit to transmit signals to one or more components external to the semiconductor device through the first layer,
wherein the one or more interconnects comprises an interconnect arranged between a perimeter of the first layer and the connected section of the second layer, such that the interconnect forms a closed loop around the one or more floating sections and such that the interconnect is located between the first layer and the second layer.

2. The semiconductor device of claim 1, wherein:
the one or more floating sections comprise a plurality floating sections; and
each floating section of the one or more floating sections is electrically floating and isolated from other floating sections of the one or more floating sections by dielectric material.

3. The semiconductor device of claim 1, wherein:
the one or more floating sections is isolated from the connected section by dielectric material.

4. The semiconductor device of claim 1, wherein the connected section and the one or more floating sections of the second layer are in a single patterned metal layer.

5. The semiconductor device of claim 1, wherein the connected section is arranged in a closed loop around the one or more floating sections.

6. The semiconductor device of claim 1, wherein the one or more interconnects comprises an interconnect arranged in a cylindrical shape between the first layer and the connected section of the second layer.

7. The semiconductor device of claim 1, further comprising:
a bond wire connected to a top surface of the first layer.

8. The semiconductor device of claim 1, wherein the plurality of discontinuous sections of the second layer is a first plurality of discontinuous sections, wherein the connected section of the second layer is a first connected section, wherein the one or more floating sections of the second layer are first one or more floating sections, wherein the one or more interconnects are first one or more interconnects, and wherein the semiconductor device further comprises:
a third layer comprising conductive material underneath the second layer; and
second one or more interconnects to couple the second layer to the third layer,
wherein the third layer comprises a second plurality of discontinuous sections that includes (i) a second connected section coupled to the second one or more interconnects and (ii) second one or more floating sections that are at least in part surrounded by the second connected section.

9. The semiconductor device of claim 8, wherein:
the first one or more floating sections of the second layer includes a first floating section;
the second one or more floating sections of the third layer includes a second floating section; and
the second floating section is at least in part underneath and offset with respect to the first floating section.

10. A bonding pad arrangement to transmit signal to and from under-pad circuits, the bonding pad arrangement comprising:
a top layer comprising conductive material;
a bond wire bonded to a top surface of the top layer;
an intermediate layer comprising conductive material, the intermediate layer between the top layer and the under-pad circuits, wherein the intermediate layer has (i) a first section to transmit signals between the top layer and the under-pad circuits and (ii) a second section that is electrically floating; and
an interconnect electrically coupling the first section of the intermediate layer to the top layer,
wherein the interconnect is arranged between a perimeter of the top layer and the intermediate layer, such that the interconnect forms a closed loop around the second section and such that the interconnect is located between the top layer and the intermediate layer.

11. The bonding pad arrangement of claim 10, wherein:
the first section of the intermediate layer is at least in part along a periphery of the intermediate layer; and
the second section of the intermediate layer is at least in part surrounded by the first section of the intermediate layer.

12. The bonding pad arrangement of claim 10, wherein:
the second section of the intermediate layer is isolated from the first section of the intermediate layer by dielectric material.

13. The bonding pad arrangement of claim 10, wherein:
the second section of the intermediate layer comprises a plurality of sub-sections, each sub-section of the plurality of sub-sections isolated from each other and from the first section of the intermediate layer by dielectric material; and
each sub-section of the plurality of sub-sections is electrically floating.

14. The bonding pad arrangement of claim 10, wherein the intermediate layer is a first intermediate layer, and wherein the bonding pad arrangement further comprises:
a second intermediate layer comprising conductive material, the second intermediate layer between the first intermediate layer and the under-pad circuits,
wherein the second intermediate layer has (i) a third section to transmit signals between the top layer and the under-pad circuits and (ii) a fourth section that is electrically floating.

15. The bonding pad arrangement of claim 14, wherein the interconnect is a first interconnect, and wherein the bonding pad arrangement further comprises:
a second interconnect electrically coupling the first section of the first intermediate layer to the third section of the second intermediate layer.

16. A semiconductor device comprising:
a first conductive layer comprising (i) one or more floating conductive sections that are electrically floating and (ii) a connected conductive section, wherein the one or more of floating conductive sections and the connected conductive section are coplanar;
a second conductive layer above the first conductive layer, the second conductive layer electrically coupled to the connected conductive section of the first conductive layer; and
a wire bonded to an upper section of the second conductive layer,
wherein a combined area of the one or more floating conductive sections is at least half of an area of a continuous section of the second conductive layer.

17. The semiconductor device of claim 16, wherein the connected conductive section at least in part surrounds the one or more floating conductive sections, and is separated from the one or more floating conductive sections by dielectric material.

18. The semiconductor device of claim 16, wherein the one or more floating conductive sections are first one or more floating conductive sections, the connected conductive section is a first connected conductive section, and wherein the semiconductor device further comprises:
a third conductive layer comprising (i) second one or more floating conductive sections that are electrically floating and (ii) a second connected conductive section,
wherein the second one or more of floating conductive sections and the second connected conductive section are coplanar,
wherein the third conductive layer is underneath the second conductive layer, and
wherein the third conductive layer is separated from the second conductive layer by dielectric material.

* * * * *